(12) United States Patent
Seki et al.

(10) Patent No.: US 8,816,568 B2
(45) Date of Patent: Aug. 26, 2014

(54) VIBRATION-TYPE DRIVING APPARATUS

(75) Inventors: Hiroyuki Seki, Oyama (JP); Takayuki Tsukimoto, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 195 days.

(21) Appl. No.: 13/150,778

(22) Filed: Jun. 1, 2011

(65) Prior Publication Data

US 2011/0309722 A1 Dec. 22, 2011

(30) Foreign Application Priority Data

Jun. 21, 2010 (JP) ................................ 2010-140251

(51) Int. Cl.
*H02N 2/12* (2006.01)
*G02B 7/10* (2006.01)
*H02N 2/10* (2006.01)
*H01L 41/053* (2006.01)

(52) U.S. Cl.
CPC ............... *H02N 2/103* (2013.01); *G02B 7/102* (2013.01); *H01L 41/053* (2013.01)
USPC ................. 310/323.16; 310/323.01

(58) Field of Classification Search
USPC ........................ 310/323.01, 323.02, 323.16
See application file for complete search history.

(56) References Cited

U.S. PATENT DOCUMENTS

| 4,678,956 A | 7/1987 | Izukawa et al. |
| 4,692,651 A | 9/1987 | Hiramatsu et al. |
| 6,078,438 A * | 6/2000 | Shibata et al. ................ 359/819 |
| 6,201,339 B1 | 3/2001 | Tani et al. |
| 7,129,618 B2 | 10/2006 | Fujimoto et al. |
| 7,365,914 B2 | 4/2008 | Sasaki et al. |
| 7,432,633 B2 * | 10/2008 | Sakano ..................... 310/323.02 |
| 7,466,062 B2 * | 12/2008 | Sakatani et al. ......... 310/323.16 |
| 7,514,845 B2 | 4/2009 | Ashizawa et al. |
| 7,969,065 B2 * | 6/2011 | Seki et al. ................ 310/323.02 |

(Continued)

FOREIGN PATENT DOCUMENTS

| CN | 1534856 A | 10/2004 |
| CN | 1913328 A | 2/2007 |

(Continued)

OTHER PUBLICATIONS

Communication dated Jun. 24, 2013, forwarding a European Search Report in European Application No. 11169256.2-1564/2398082.

(Continued)

*Primary Examiner* — Derek Rosenau
*Assistant Examiner* — Bryan Gordon
(74) *Attorney, Agent, or Firm* — Fitzpatrick, Cella, Harper & Scinto (57) ABSTRACT

A vibration-type driving apparatus includes a vibrator holder, wherein a plurality of vibrators each having at least an electro-mechanical energy conversion element and an elastic member having a contact portion formed therein are connected to a vibrator holding member, for generating an ellipsoidal movement of the contact portion, to move, relative to the vibrator, a driving member contacting the contact portion. The plurality of vibrators are connected to a surface of the holding member at a side at which the contact portion contacts the driving member, and on a surface of the vibrator holding member opposite to the side at which the contact portion contacts the driving member, a pressing member is placed to set the contact portion to be pressed and contacted to the driving member.

20 Claims, 7 Drawing Sheets

(56) References Cited

U.S. PATENT DOCUMENTS

| | | | |
|---|---|---|---|
| 2004/0189150 A1* | 9/2004 | Yamamoto et al. | 310/323.02 |
| 2005/0253484 A1* | 11/2005 | Kishi et al. | 310/323.16 |
| 2005/0253485 A1* | 11/2005 | Kishi | 310/323.16 |
| 2006/0186760 A1* | 8/2006 | Sakano | 310/323.02 |
| 2009/0167111 A1* | 7/2009 | Mori | 310/323.16 |
| 2010/0141091 A1 | 6/2010 | Sakamoto | |

FOREIGN PATENT DOCUMENTS

| | | |
|---|---|---|
| EP | 2 161 767 A2 | 3/2010 |
| JP | 61-262091 A | 11/1986 |
| JP | 03-270679 A | 12/1991 |
| JP | 08-251953 A | 9/1996 |
| JP | 09-201079 A | 7/1997 |
| JP | 11-235062 A | 8/1999 |
| JP | 11-341845 A | 12/1999 |
| JP | 2007-097317 A | 4/2007 |
| JP | 2009-027769 A | 2/2009 |
| JP | 2009-201322 A | 9/2009 |
| WO | 2009/128385 A1 | 10/2009 |

OTHER PUBLICATIONS

Notification of the First Office Action dated Jul. 30, 2013, in Chinese Application No. 201110167312.8.

* cited by examiner

VIBRATION-TYPE DRIVING APPARATUS

BACKGROUND OF THE INVENTION

1. Field of the Invention

The present invention relates to a vibration-type driving apparatus, and more particularly to a vibration-type driving apparatus having a structure in which a vibrator is pressed and contacted to a driving member.

2. Related Background Art

A vibration-type driving apparatus (vibration wave motor) is adapted so that vibrators, each having an electro-mechanical energy conversion element (for example, a piezoelectric element) and an elastic member (mainly of metal) connecting the electro-mechanical energy conversion elements, excites vibrations of a plurality of vibration modes.

Vibrations of the plurality of vibration modes are synthesized to generate an ellipsoidal movement of a surface of the elastic member, and relatively drive the driving member contacting the elastic member. Various types of such vibration-type driving apparatuses have been proposed, and particularly, many vibration-type driving apparatuses have been proposed as actuators that rotationally drive a lens barrel of a camera.

Among these apparatuses, many actuators have been recently proposed having a structure with a combination of plate shape vibrators (chip shaped vibrators) having a rectangular vibrating portion as a type that can both save space and reduce cost and has high flexibility in design of size or shape of a lens barrel.

As a vibration-type driving apparatus including a combination of such chip shaped vibrators, U.S. Pat. No. 6,078,438 proposes a vibration-type driving apparatus as described below.

This apparatus includes a chip shaped vibrator having at least one vibration node, a supporting member that supports the vibrator, and a rotatable rotor (driving member), and the supporting member also serves as a pressing spring that urges a pressing force between the rotor and the vibrator.

The supporting member and the pressing spring are adapted so that a part of a ring-shaped base is bent in a rotational axis direction (pressing direction) by bending in a cantilever, and the vibrator is independently supported at an end thereof.

U.S. Pat. No. 7,466,062 proposes a vibration-type driving apparatus having a structure in which a vibrator has a shape (block shape) with a thickness in a pressing direction, and the vibrator is independently supported and pressed as in U.S. Pat. No. 6,078,438.

In the apparatuses in U.S. Pat. No. 6,078,438 and U.S. Pat. No. 7,466,062, a member for supporting the vibrator and a pressing spring are shared. This reduces support rigidity, but such a structure has a problem as described below.

Specifically, when the rotor is in a non-driving state and no driving reaction is applied to the vibrator, a satisfactory contact state between the vibrator and the rotor is maintained.

However, when a driving force is generated in the vibrator, a rotational moment is generated between the contact portion with the rotor and the supporting portion in the vibrator. Thus, if support rigidity (rotation rigidity) of the vibrator is low, the vibrator is easily tilted with respect to a sliding surface of the rotor.

This causes non-uniform contact plane pressure of the vibrator to worsen the contact state with the rotor, which may reduce output or cause abnormal noise such as a squeak.

In view of the above-described problem, the present invention has a driving member to provide a vibration-type driving apparatus that can configure a vibrator holder that maintains low rigidity of a vibrator in a pressing direction and has high rigidity for a rotational moment applied to the vibrator by driving, and can stably maintain a contact state between the vibrator and a driving member.

SUMMARY OF THE INVENTION

According to the present invention, a vibration-type driving apparatus can be realized that can configure a holding structure that maintains low rigidity of a vibrator in a pressing direction and has high rigidity for a rotational moment applied to the vibrator by driving, and can stably maintain a contact state between the vibrator and a driving member.

A vibration-type driving apparatus according to an aspect of the present invention comprises: a vibrator holder wherein a plurality of vibrators each having at least an electro-mechanical energy conversion element and an elastic member having a contact portion formed therein are connected to a vibrator holding member, for generating an ellipsoidal movement of the contact portion, to move, relative to the vibrators, a driving member contacting the contact portion, wherein the plurality of vibrators are connected to a surface of the vibrator holding member at a side at which the contact portion contacts the driving member, and, on an opposite surface of the vibrator holding member opposite to the side at which the contact portion contacts the driving member, a pressing member is placed to set the contact portion to be pressed to and contacted to the driving member.

Further features of the present invention will become apparent from the following description of exemplary embodiments with reference to the attached drawings.

BRIEF DESCRIPTION OF THE DRAWINGS

FIGS. 2A and 2B illustrate a configuration of a vibrator of the vibration-type driving apparatus according to Embodiment 1 of the present invention.

DESCRIPTION OF THE EMBODIMENTS

Preferred embodiments of the present invention will now be described in detail in accordance with the accompanying drawings.

Modes for carrying out the present invention will be described by embodiments below.

EMBODIMENTS

Embodiment 1

As Embodiment 1, an exemplary configuration of a vibration-type driving apparatus to which the present invention can be applied will be described with reference to FIGS. 1 to 4.

A vibration-type driving apparatus of this embodiment includes a vibrator having at least an electro-mechanical energy conversion element and an elastic member having a contact portion formed therein, and a vibrator holding member to which a plurality of vibrators are connected. The vibrator and the vibrator holding member constitute a vibrator holder. A driving voltage is applied to the electro-mechanical energy conversion element to generate an ellipsoidal movement of the contact portion of the elastic member, and a driving member contacting the contact portion of the elastic member is moved relative to the vibrators by the ellipsoidal movement.

As the vibrator, a plate shape vibrator (chip shaped vibrator) having an elastic member formed of a rectangular plate is used in this embodiment. The chip shaped vibrator is referred to as a vibrator in descriptions below.

Figure 1:
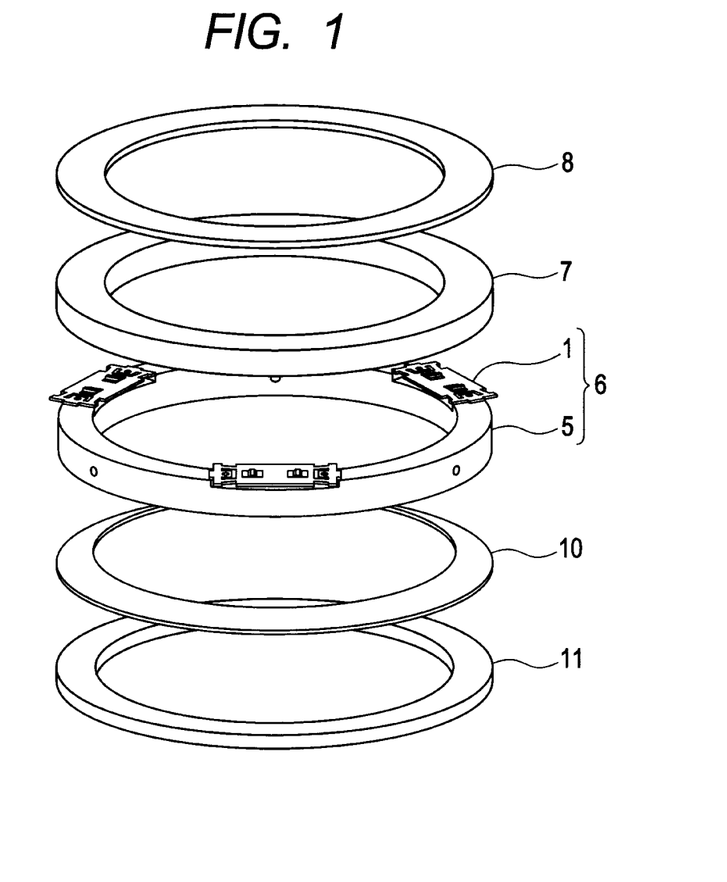
FIG. 1 is a perspective view illustrating a configuration of a vibration-type driving apparatus according to Embodiment 1 of the present invention.

As shown in FIG. 1, a vibrator 1 is connected to a vibrator holding member 5 to constitute a vibrator holder 6.

In FIG. 1, reference numeral 7 denotes a rotor (driving member); 8, a rotor rubber; 10, a pressing spring; and 11, a pressing ring.

Figure 2A:
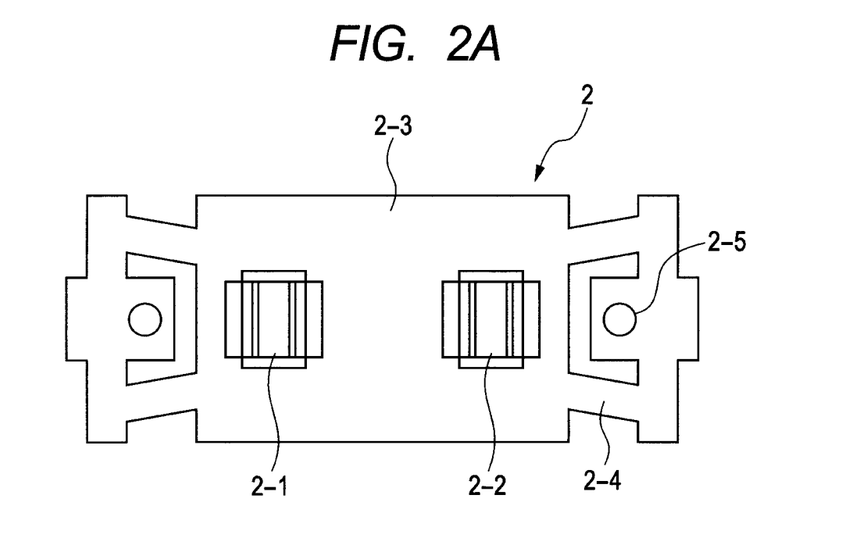
FIG. 2A is a plan view of the vibrator.
Figure 2B:
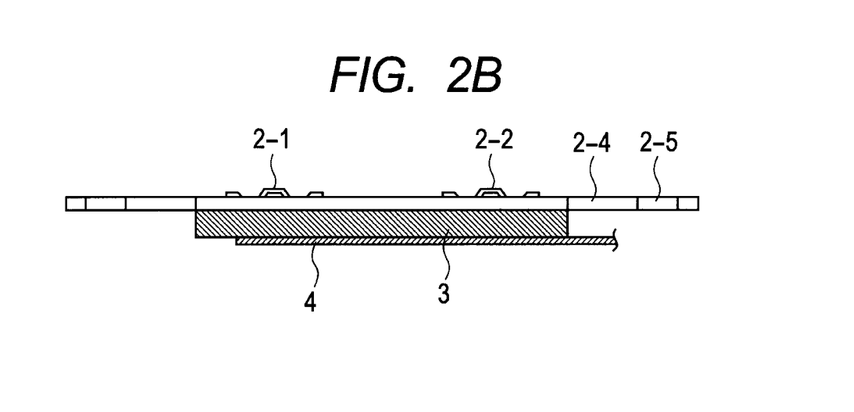
FIG. 2B is a side view thereof.

As shown in FIGS. 2A and 2B, the vibrator 1 includes an elastic member 2, a piezoelectric element (electro-mechanical energy conversion element) 3, and a flexible printed circuit (FPC) 4 that supplies power to a piezoelectric element.

The elastic member 2 that constitutes the vibrator 1 includes a vibrating portion 2-3 that is formed of a member having low vibration damping and vibrating together with the piezoelectric element.

The elastic member 2 also includes a fixing portion 2-5 for fixing the elastic member to a different member, and a supporting portion 2-4 that connects the vibrating portion 2-3 and the fixing portion 2-5, has one end following vibration of the vibrating portion 2-3, and the other end that does not transmit vibration to the fixing portion 2-5.

Figure 3:
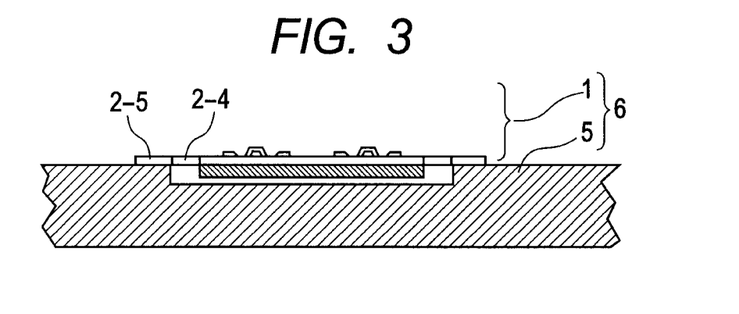
FIG. 3 is a sectional view illustrating a configuration of a vibrator holder of the vibration-type driving apparatus according to Embodiment 1 of the present invention.

The fixing portions 2-5 of the plurality of vibrators thus configured are integrally connected to a part of a surface on a side at which the contact portions 2-1 and 2-2 of the vibrator 1 contact the rotor 7 in the vibrator holding member 5 (that is, a surface of the vibrator holding member 5 on a rotor side) (FIG. 3).

The vibrator holding member can be formed of a member having a larger mass than a total mass of the vibrating portion and the supporting portion of the vibrator.

The vibrator holder 6 includes a plurality of contact portions (upper surfaces of the contact portions 2-1 and 2-2 in FIGS. 2A and 2B) of the vibrator formed on one surface (upper surface in FIG. 3), and the contact portions are placed in the same plane.

Figure 4:
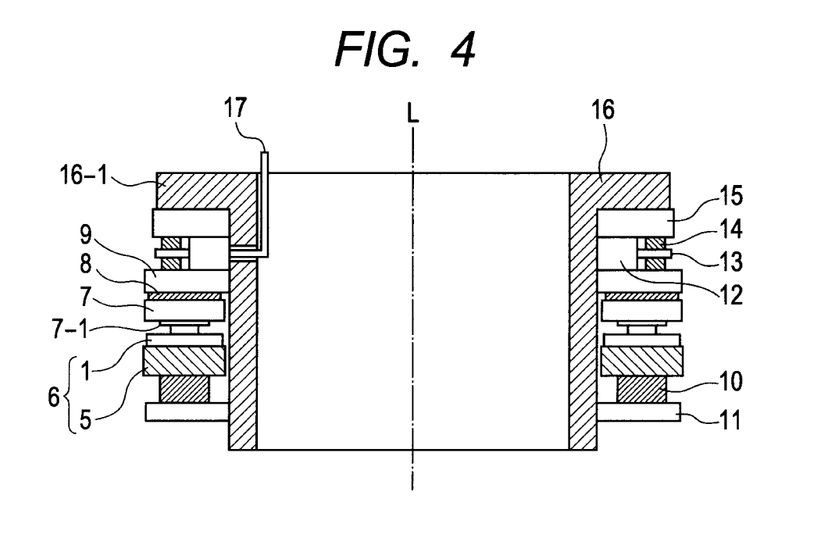
FIG. 4 is a sectional view of a lens barrel mounting state according to Embodiment 1 of the present invention.

As shown in FIG. 4, the rotor 7 has a wear resistant sliding portion 7-1 in one surface, and the sliding portion 7-1 is placed to face and contact the contact portion of the vibrator holder.

On a side of the rotor 7 opposite to the sliding portion, an output transfer member 9 is provided with a rotor rubber (vibration proof rubber) 8 therebetween.

On the other hand, on the side of the vibrator holder 6 opposite to the rotor 7, as shown in FIGS. 1 and 4, a plate spring 10 is provided as a pressing member for pressing the vibrator holder 6 against the rotor 7.

In order to compress the plate spring 10 and generate a pressing force, a pressing ring 11 that controls a bending amount of the plate spring 10 is provided, and the pressing ring 11 and the vibrator holder 6 hold the plate spring 10 therebetween. Thus, an appropriate pressing force is applied between the vibrator holder 6 and the rotor 7.

Next, a structure when the vibration-type driving apparatus is configured as a driving unit of a lens barrel will be described with reference to FIG. 4.

A lens barrel unit body 16 has a flange 16-1 overhanging perpendicularly to a direction of an optical axis L, and a manual ring 15 is provided on one surface of the flange.

Also, a plurality of roller shafts 13 formed to extend radially from a roller ring 12 and rollers 14 engaging the roller shafts 13 and rotatably mounted around the roller shafts are provided. The output transfer member 9 and the manual ring 15 are stacked in the direction of the optical axis L with the roller 14 therebetween.

An inner peripheral side of the pressing ring 11 engages the lens barrel body 16 by a screw or a bayonet structure. The pressing ring is rotated and moved in the direction of the optical axis L to compress the pressing spring 10, and press and hold a section from the vibrator holder 6 via the manual ring 15 to the body flange 16-1.

An AC electric field of a frequency f0 is applied from an unshown power supply to the vibrator 1 to gradually sweep the frequency to a lower side. Then, vibration is excited in the vibrator, and a vibration amplitude gradually increases as the frequency approaches a resonant frequency of the vibrator.

At this time, an ellipsoidal movement of the contact portion of the vibrator 1 is generated, and a friction driving force is generated in the rotor 7 contacting the contact portion. Thus, the rotor 7, the rotor rubber 8, and the output transfer member 9 are rotated around the optical axis L.

The roller 14 contacting the output transfer member 9 rotates around the optical axis L together with the roller ring 12 while rolling on a surface of the manual ring 15, and an output key 17 provided on the roller ring rotates an unshown cam ring to perform an autofocus operation.

At this time, the rotor includes an unshown rpm detection unit, and thus sweeping of the frequency is stopped when the rotor reaches a target rpm to obtain a desired output. If the frequency is reduced but the target rpm is not reached, the frequency is swept to fr_max described below to stop the sweeping. Specifically, a frequency range used for driving is fr_max to f0.

This is because driving at a frequency of fr_max or less extremely reduces vibration amplitude of a vibration mode with fr_max as a resonant frequency to prevent normal driving of the rotor.

Herein, fr_max represents a maximum resonant frequency in the vibration mode of the vibrator that contributes to driving.

Next, a configuration of the vibrator holder that is a characteristic feature of the present invention will be described.

In this embodiment, a plurality of vibrators are placed on a circumferential surface (rotor side surface) of the vibrator holding member integrally formed into a ring shape (shape of annular circle), and the vibrator and the vibrator holding member are directly connected by an adhesive to constitute the vibrator holder.

Thus, each vibrator has very high support rigidity, and each vibrator cannot independently follow the sliding surface (surface of the sliding portion) of the rotor.

However, a moment generated by a frictional reaction of each vibrator generated by driving is cancelled in the entire vibrator holder. This prevents tilting or partial contact of the vibrator holder by the frictional reaction, and allows a satisfactory contact state to be maintained.

On the other hand, the contact portions of the vibrators connected to the vibrator holding member are formed in the same plane.

The vibrator holder is adopted so that the entire circumference is uniformly pressed from a back surface (surface opposite to the rotor) by a pressing spring having a small spring constant, and thus each vibrator can be pressed and contacted to the rotor without uneven pressing.

According to the configuration of this embodiment, a vibrator holder can be configured that maintains low rigidity of a vibrator in a pressing direction and has high rigidity for a rotational moment applied to the vibrator by driving with torque being applied.

This can stably maintain a contact state between the vibrator and the driving member, provide a stable output characteristic, and reduce noise such as squeaking caused by an unstable contact state.

In this embodiment, jigs are improved so that when the vibrator and the vibrator holding member are bonded to each other to maintain a stable contact between the rotor and the sliding portion, the vibrator holding member can be bonded with the contact portions of the plurality of vibrators being maintained in the same plane.

Also, an imaginary plane including each contact portion (surface) is subjected to smoothing treatment such as lapping after bonding and finished to have flatness of 10 µm or less.

Also for the rotor 7, a surface to be a sliding portion is subjected to smoothing treatment such as lapping and finished to have surface roughness of Ra 0.5 µm or less and flatness of 10 µm or less.

The ring shaped vibrator holding member is directly connected to the vibrator, and thus slight driving vibration leaking from the vibrator may excite, as an excitation source, a resonant mode of the holding member. In particular, a vibration mode of an order equal to an integer multiple (once, twice, three times . . . ) of an order (the number of crests of wave) of a vibration mode with a wavelength equal to an interval between connecting portions of the vibrators connected to the vibrator holding member is easily excited.

To the vibrator holder of this embodiment, an exciting force from the contact portions of the plurality of vibrators is input, and thus a vibration mode of an order equal to an integer multiple of an order of a vibration mode with a wavelength equal to a pitch between input points, that is, a pitch between the vibrators (an interval between the vibrators) is easily excited. In this embodiment, three vibrators are arranged at regular intervals in the vibrator holding member to constitute the vibrator holder. Thus, when the rotor is driven, an exciting force is applied from the contact portion of the vibrator at 120° intervals. Thus, for the vibrator holder, the vibration mode having three crests of wave on one round (three order bending vibration mode) is easily excited, which may cause noise. Also, in this embodiment, a vibration mode of an order equal to an integer multiple of three, that is, three order, six order, nine order, twelve order . . . may be excited.

Thus, in this embodiment, the vibrator holder is designed so that the resonant frequency of the vibration mode of the vibrator holder (a vibration mode of an order equal to an integer multiple of an order of a vibration mode with a wavelength equal to an interval between connecting portions of the vibrators or a vibration mode of an order equal to an integer multiple of an order of a vibration mode with a wavelength equal to an interval between the vibrators) is not within a frequency range used for the driving described above.

Embodiment 2

Figure 5:
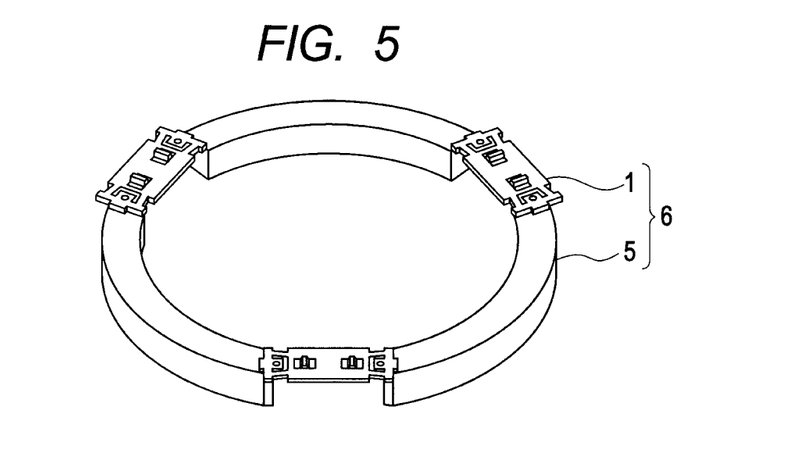
FIG. 5 is a perspective view of a vibrator holder of a vibration-type driving apparatus according to Embodiment 2 of the present invention.

As Embodiment 2, an exemplary configuration of a vibration-type driving apparatus having a different configuration of a vibrator holding member from that of Embodiment 1 will be described with reference to FIG. 5.

In this embodiment, unlike the vibrator holding member integrally formed into a ring shape as in Embodiment 1, a vibrator holding member 5 is formed into a ring shape by three circular arc shaped members. The plurality of circular arc shaped members are connected by vibrators 1 to constitute a vibrator holder 6.

This is because dividing the vibrator holding member 5 into circular arc shaped members allows effective use of material and can reduce machining cost as compared to integrally machining the vibrator holding member 5 into a ring shape as in Embodiment 1.

Also, when the vibrators are connected to the vibrator holding member 5, contact portions of the vibrators can be easily placed in the same plane.

For example, in Embodiment 1, it is sometimes demanded that a step of lapping (polishing) or grinding is inserted after connection between the vibrator 1 and the vibrator holding member 5 to perform flat finish to obtain flatness of the contact portion of the vibrator.

This is because flatness of the contact portion after connection of the vibrator depends on flatness of the vibrator holding member before connection.

On the other hand, as in this embodiment, when the vibrator holding member 5 is constituted by a plurality of divided members, the contact portion of the vibrator can be aligned with a reference plane in connection, and the vibrator holding member can be connected in alignment with the vibrator.

This can be realized by, for example, finishing a reference surface of a connecting jig to have flatness of 0.1 to 0.5 µm, abutting the contact portion of the vibrator with reference to the surface to hold the vibrator in the position, and connecting the divided vibrator holding member in alignment therewith. This eliminates the need for machining to provide flatness after connection of the vibrator.

Also in this embodiment, the vibration-type driving apparatus is adapted so that the circumference is pressed from a back surface of the vibrator holding member by a plate spring that is a pressing member as in Embodiment 1. The vibrator having the same configuration as in Embodiment 1 can be used. The vibrator and the vibrator holding member can be connected by laser welding and firmly fixed.

Embodiment 3

Figure 6:
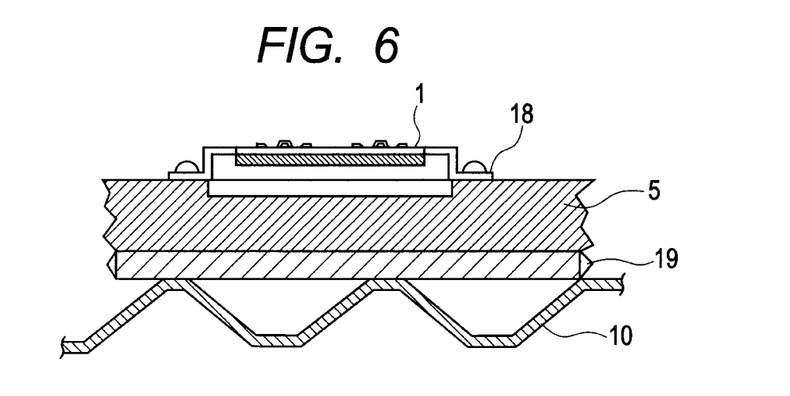
FIG. 6 is a perspective view of a vibrator holder of a vibration-type driving apparatus according to Embodiment 3 of the present invention.

As Embodiment 3, an exemplary configuration of a vibration-type driving apparatus different from those of the above embodiments will be described with reference to FIG. 6.

In this embodiment, a supporting portion 2-4 (see FIGS. 2A and 2B) of a vibrator has a bent shape formed to be bent toward an outside of a surface of a vibrator holding member through which the vibrator is connected, and a vibrator holding member 5 and a fixing portion of the vibrator 1 are connected by fastening a screw 18.

A rubber sheet 19 as a vibration transmission suppressing member is held between a pressing spring 10 (wave spring) and the vibrator holding member 5 to configure a lower structure of the vibrator.

According to the configuration of this embodiment, noise can be reduced due to chatter vibration between a plate spring and the vibrator holding member caused by vibration leaking from the vibrator.

In this embodiment, the rubber sheet is held between the vibrator holding member and the pressing spring, but not limited to this, for example, felt may be used as long as it suppresses vibration transmission.

Embodiment 4

Figure 7:
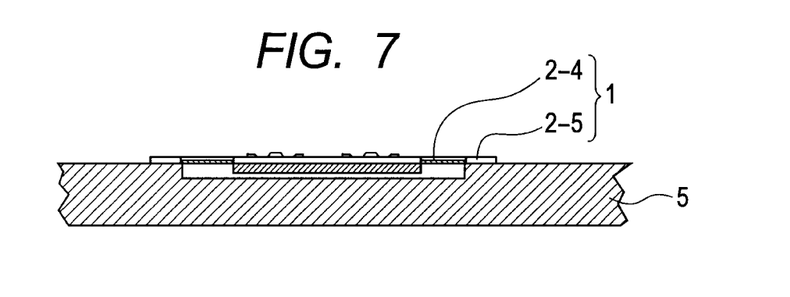
FIG. 7 is a sectional view of a vibrator holder of a vibration-type driving apparatus according to Embodiment 4 of the present invention.

As Embodiment 4, an exemplary configuration of a vibration-type driving apparatus having a different configuration of a vibrator from those of the above embodiments will be described with reference to FIG. 7.

In this embodiment, Embodiment 1 is partially improved to further improve a leaking vibration reducing function of a vibrator.

In this embodiment, a supporting portion 2-4 of the vibrator is thinner than those in other embodiments.

Thus, bending rigidity of the supporting portion 2-4 is further reduced to further improve capability of following vibration of a vibrating portion 2-3 without increasing a size of a supporting portion, and reduce support loss.

The configuration of this embodiment can reduce transfer of leaking vibration to a fixing portion 2-5, and can eliminate causes of unnecessary vibration that excites the vibrator holder.

In this embodiment, the thickness of the supporting portion is changed to reduce rigidity, but not limited to this.

For example, a width of the supporting portion may be reduced or a length of the supporting portion may be increased to reduce static bending rigidity as compared to that of the vibrating portion.

Embodiment 5

As Embodiment 5, an exemplary configuration of a vibration-type driving apparatus different from those of the above embodiments will be described with reference to FIGS. 8A to 8C.

In this embodiment, a vibrator holding member is formed of a thin plate, and a connecting surface of the vibrator holding member through which a vibrator is connected is a convex portion formed to be bent toward an outside of a surface of the vibrator holding member through which the vibrator is connected.

Figure 8A:
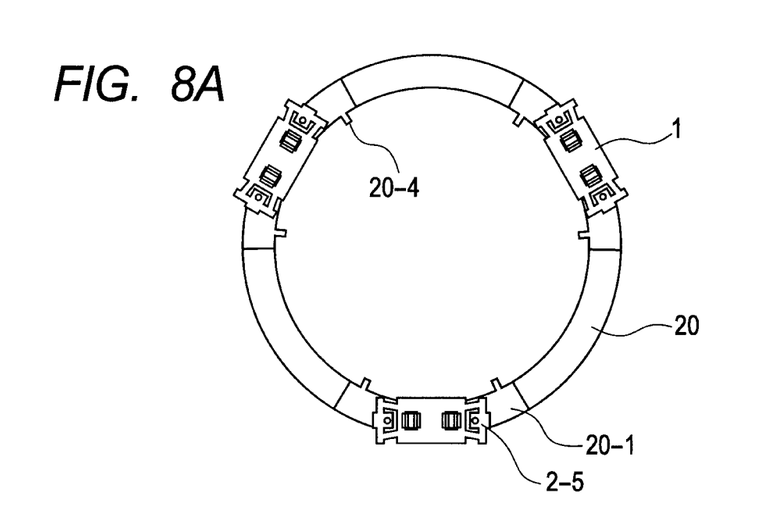
FIGS. 8A, 8B and 8C are plan and perspective views of a vibrator holder of a vibration-type driving apparatus according to Embodiment 5 of the present invention.
Figure 8B:
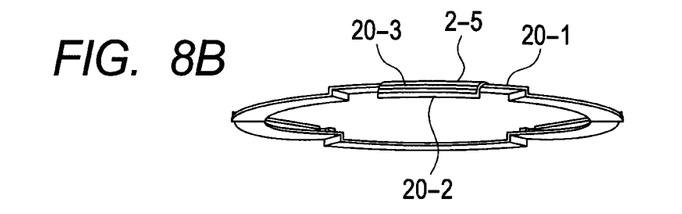
Figure 8C:
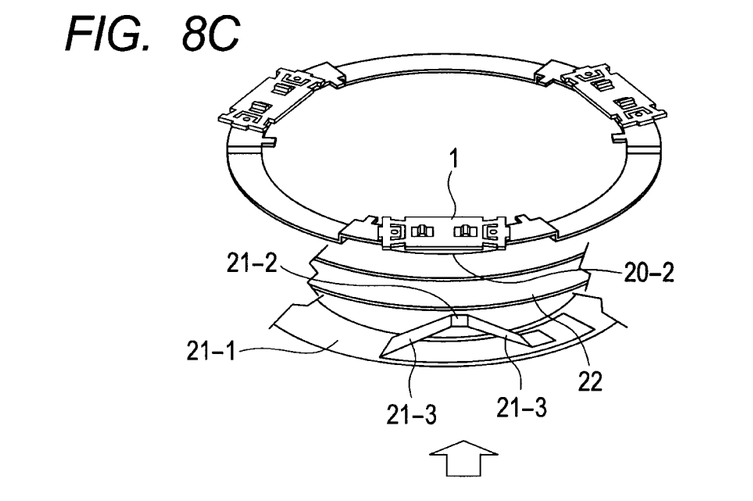

As shown in FIGS. 8A to 8C, in a plate shape vibrator holding member 20, six convex portions (steps) 20-1 are formed in a circumferential direction by being bent 1 toward an outside of one surface of the vibrator holding member through which the vibrator is connected. A fixing portion 2-5 of the vibrator is connected to each of the convex portions to form the vibrator holder.

A piezoelectric element 3 and a flexible printed circuit 4 connected to the vibrator 1 are placed in a recess 20-3 formed between the convex portions with an appropriate clearance from the vibrator holding member 20.

A plurality of detent convex portions 20-4 are formed on an inner peripheral side of the vibrator holding member 20, and engage a plurality of grooves (not shown) formed in a body correspondingly to the detent convex portions 20-4 and receive a reaction of torque generated in driving a rotor to prevent rotation of the vibrator holder.

As a pressing spring 21 that is a pressing member, a plate spring is used having a cantilever structure with three bent portions on a circumference of the ring-shaped thin plate.

The plate spring is placed on a back side (side opposite to a contact portion) of each vibrator, and the contact portion between the plate spring and the elastic member is set such that a point on which a pressing contact force onto a driving member is exerted is almost at a middle of the cantilever, and deformed portions are provided on opposite sides of the point.

Specifically, the plate spring has two bent portions 21-3 toward an outside of a base plate 21-1, and a pressing portion 21-2 parallel to a base portion is formed in a middle portion.

The pressing portion 21-2 is adapted to press a bent portion 20-2 of the vibrator holding member placed on the back side of the vibrator via a vibration insulating member 22 (such as felt).

With the above-described structure, bending rigidity of the entire vibrator holder is reduced. Thus, even with somewhat low flatness of the contact portion of the elastic member in the vibrator, the vibrator holder is elastically deformed to obtain a satisfactory contact state following a surface of the sliding portion.

For a moment by a driving reaction, a section between detent protrusions 20-4 provided to hold the vibrator therebetween is deformed, thereby reducing tilt of a friction surface by a driving force.

Embodiment 6

Figure 9:
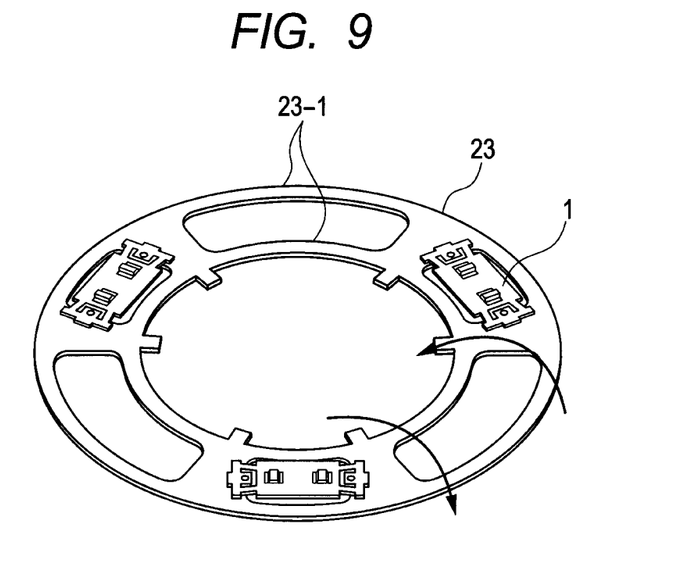
FIG. 9 is a perspective view of a vibrator holder of a vibration-type driving apparatus according to Embodiment 6 of the present invention.

As Embodiment 6, an exemplary configuration of a vibration-type driving apparatus having a different structure of a holding member from those of the above embodiments will be described with reference to FIG. 9.

In this embodiment, bending rigidity and torsional rigidity of a vibrator holding member are further reduced.

Thus, in this embodiment, a thin plate is bent at six spots by pressing to form a vibrator holding member 23 as in FIGS. 8A to 8C, and a notch is provided in an intermediate portion between connecting portions of a vibrator 1, and notches are connected by a narrow beam 23-1.

With the configuration of this embodiment, the entire vibrator holder has satisfactory following capability of waves (wave component toward an outside of a plane in a circumferential direction, or torsional component around an axis along a circumference) in a sliding surface of a rotor.

Embodiment 7

As Embodiment 7, an exemplary configuration of a vibration-type driving apparatus different from those of the above embodiments will be described with reference to FIGS. 10A and 10B.

In the embodiments described above, the pressing force to the contact portion of the vibrator is applied via the vibrator holding member, and the supporting portion 2-4 of the vibrator 1 serves to transfer the pressing force.

On the other hand, in this embodiment, a pressing force is directly applied to a vibrating portion (back surface of a piezoelectric element) of a vibrator 1.

Figure 10A:
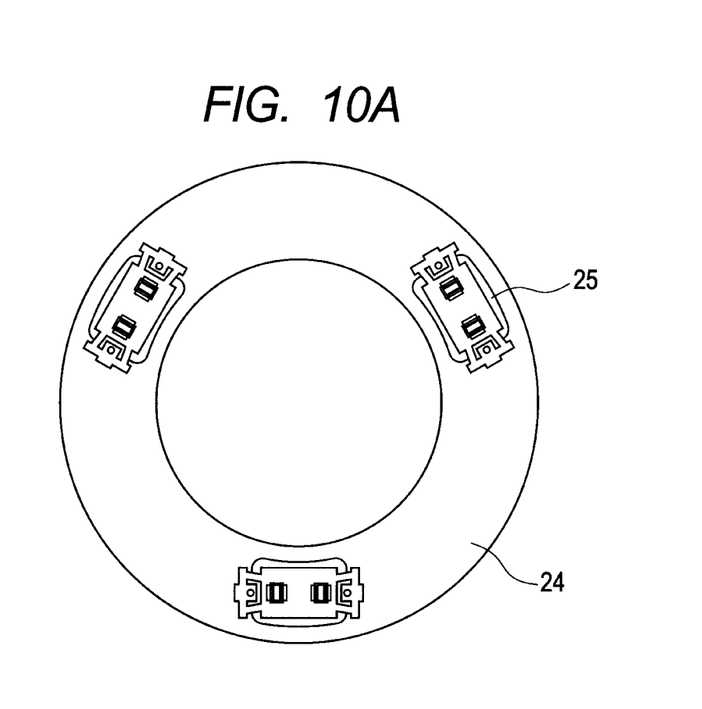
FIGS. 10A and 10B are plan and perspective views of a vibrator holder of a vibration-type driving apparatus according to Embodiment 7 of the present invention.
Figure 10B:
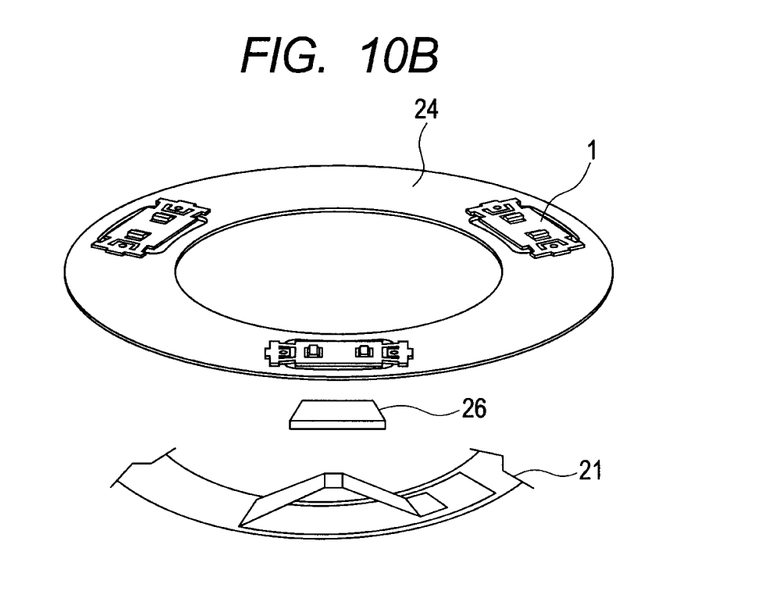

As shown in FIGS. 10A and 10B, a vibrator holding member 24 is formed of a ring member of a thin plate and a hole 25 is provided in a portion where the vibrating portion and the supporting portion of the vibrator interfere with each other so that the piezoelectric element of the vibrator or a flexible printed circuit does not contact the vibrator holding member 24.

A pressing spring is a plate spring as shown in FIGS. 8A to 8C, and a pressing force is applied to the vibrator via a vibration insulating member 26 (such as felt) between a pressing portion 21-2 of the plate spring and the piezoelectric element of the vibrator.

With the configuration of this embodiment, the pressing force is not directly applied to the supporting portion 2-4 of the vibrator, thereby increasing flexibility in strength design of a supporting portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-140251, filed Jun. 21, 2010, which is hereby incorporated by reference herein in its entirety.

What is claimed is:

1. A vibration-type driving apparatus comprising:
    a vibrator holder comprising:
        a vibrator holding member;
        a plurality of vibrators each comprising:
            an electro-mechanical energy conversion element; and
            an elastic member comprising a vibrating portion, a contact portion provided on the vibrating portion, and a first supporting portion and a second supporting portion extended from the vibrating portion, the electro-mechanical energy conversion element being in direct contact with the elastic member; and
        a pressing member configured to cause pressure between at least one of the vibrators and a driving member,
    wherein relative positions of the plurality of vibrators and the driving member change,
    wherein the plurality of vibrators are connected to the vibrator holding member, and
    wherein the vibrating portion of each of the plurality of vibrators is located between the first supporting portion and the second supporting portion in a driving direction.

2. The vibration-type driving apparatus according to claim 1, wherein
    the vibrators are fixed to the vibrator holder so that the contact portions formed in the plurality of vibrators are in the same plane.

3. The vibration-type driving apparatus according to claim 1, wherein
    the first supporting portion and the second supporting portion each have a shape of smaller bending rigidity than that of the vibrating portion.

4. The vibration-type driving apparatus according to claim 1, wherein
    the vibrator holder is formed of a member having a larger mass than a sum of a mass of the vibrating portion, a mass of the first supporting portion, and a mass of the second supporting portion.

5. The vibration-type driving apparatus according to claim 1, wherein
    the vibrator holder is formed in a shape of an annular circle.

6. The vibration-type driving apparatus according to claim 5, wherein
    the vibrator holder formed in a shape of an annular circle comprises a plurality of members connected together through the vibrators.

7. The vibration-type driving apparatus according to claim 5, wherein
    the vibrator holder comprises a thin plate, the vibrator holder has a convex portion formed by being bent toward an outside of a plane through which the vibrating portions are connected to the vibrator holder, and the vibrator is connected to the convex portion.

8. The vibration-type driving apparatus according to claim 1, wherein
    the vibrator holder is formed such that a resonant frequency of a vibration mode of an order equal to an integer multiple of a vibration mode with a wavelength equal to an interval between connecting portions of the vibrators to the vibrator holder is not within a frequency range used for driving the driving member.

9. The vibration-type driving apparatus according to claim 1, wherein
    the vibrator holder is formed such that a resonant frequency of a vibration mode of an order equal to an integer multiple of a vibration mode with a wavelength equal to an interval between the vibrators is not within a frequency range used for driving the driving member.

10. The vibration-type driving apparatus according to claim 1, wherein the pressing member is placed to set the contact portions to be pressed to and to be contacted to the driving member.

11. The vibration-type driving apparatus according to claim 1, wherein the driving member moves relative to the vibrators by an ellipsoidal movement of the contact portions.

12. A vibration-type driving apparatus comprising:
    a vibrator holding member;
    a vibrator comprising:
        an electro-mechanical energy conversion element; and
        an elastic member comprising a vibrating portion, a contact portion provided on the vibrating portion, and a first supporting portion and a second supporting portion extended from the vibrating portion, the electro-mechanical energy conversion element being in direct contact with the elastic member; and
    a pressing member configured to cause pressure between the vibrator and a driving member,
    wherein a relative position of the vibrator and the driving member changes,
    wherein the vibrator is connected to the vibrator holding member, and
    wherein the vibrating portion is located between the first supporting portion and the second supporting portion in a driving direction.

13. The vibration-type driving apparatus according to claim 12, wherein the vibrator comprises:
    a first fixing portion which is extended from the first supporting portion; and
    a second fixing portion which is extended from the second supporting portion,
    wherein the first fixing portion and the second fixing portion are fixed to a vibrator holder.

14. The vibration-type driving apparatus according to claim 12, wherein the pressing member is placed to set the contact portion to be pressed to and to be contacted to the driving member.

15. The vibration-type driving apparatus according to claim 12, wherein the driving member moves relative to the vibrator by an ellipsoidal movement of the contact portion.

16. The vibration-type driving apparatus according to claim 12, wherein the first and second supporting portions have a shape of smaller bending rigidity than that of the vibrating portion.

17. The vibration-type driving apparatus according to claim 12, wherein the vibrator holding member is formed of a member having a larger mass than a sum of a mass of the vibrating portion, a mass of the first supporting portion and a mass of the second supporting portion.

18. A vibration-type driving apparatus comprising:
a vibrator holding member; and
a plurality of vibrators each comprising:
an electro-mechanical energy conversion element; and
an elastic member,
wherein the electro-mechanical energy conversion element is in direct contact with the elastic member,
wherein the plurality of vibrators move relative to a driving member,
wherein the plurality of vibrators are connected to the vibrator holding member, and
wherein the vibrator holding member and the plurality of vibrators are configured to maintain low rigidity of the plurality of vibrators in a direction from the driving member toward the plurality of vibrators, and configured to have high rigidity for a rotational moment applied to the plurality of vibrators generated by driving of the vibrators.

19. The vibration-type driving apparatus according to claim 18, wherein the plurality of vibrators are attached to the vibrator holding member to make the rigidity for the rotational moment high.

20. The vibration-type driving apparatus according to claim 18, wherein the driving member moves relative to the vibrators by an ellipsoidal movement of contact portions of the vibrators.

* * * * *